(12) United States Patent
Amagai et al.

(10) Patent No.: US 7,679,002 B2
(45) Date of Patent: Mar. 16, 2010

(54) SEMICONDUCTIVE DEVICE HAVING IMPROVED COPPER DENSITY FOR PACKAGE-ON-PACKAGE APPLICATIONS

(75) Inventors: Masazumi Amagai, Ibaraki (JP); Kenji Masumoto, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 819 days.

(21) Appl. No.: 11/466,219

(22) Filed: Aug. 22, 2006

(65) Prior Publication Data

US 2008/0048303 A1 Feb. 28, 2008

(51) Int. Cl.
*H05K 1/16* (2006.01)
(52) U.S. Cl. .................................. 174/260; 361/792
(58) Field of Classification Search ............ 174/260; 361/792–795
See application file for complete search history.

(56) References Cited

U.S. PATENT DOCUMENTS 6,291,775 B1  9/2001  Saitoh
6,864,434 B2  3/2005  Chang et al.
2002/0066949 A1 * 6/2002 Ahn et al. .................. 257/684
2005/0019981 A1 * 1/2005 Wang ........................ 438/108
2005/0133249 A1 * 6/2005 Fujii ........................... 174/250

* cited by examiner

*Primary Examiner*—Jeremy C Norris
(74) *Attorney, Agent, or Firm*—Yingsheng Tung; Wade J. Brady, III; Frederick J. Telecky, Jr.

(57) ABSTRACT

In one aspect, the invention provides a semiconductor device that comprises a semiconductor device packaging substrate core. A first interconnect structure is located within a mold region and on a die side of the substrate core and has a first conductive metal density associated therewith. A second interconnect structure is located within the mold region and on a solder joint side of the substrate core and has a second conductive metal density associated therewith, wherein the second conductive metal density within the mold region is about equal to or less than the first conductive metal density within the mold region.

11 Claims, 4 Drawing Sheets

| LEG | 1 | 2 | 3 | 4 | 5 | 6 | 7 |
|---|---|---|---|---|---|---|---|
| 1 | 80% | 80% | 40% | 40% | 80% | STD | STD |
| 2 | 80% | 80% | 40% | 80% | 40% | LESS | LESS |
| 3 | 80% | 40% | 80% | 40% | 80% | LESS | LESS |
| 4 | 80% | 40% | 80% | 80% | 40% | STD | STD |
| 5 | 40% | 80% | 80% | 40% | 40% | STD | LESS |
| 6 | 40% | 80% | 80% | 80% | 80% | LESS | STD |
| 7 | 40% | 40% | 40% | 40% | 40% | LESS | STD |
| 8 | 40% | 40% | 40% | 80% | 80% | STD | LESS |
| PARAMETER | A | B | C | D | E | F | G |
| | MOLD L1 | L2/L3 | MOLD L4 | OUT L1 | OUT L4 | S/R L1 | S/R L4 |

US 7,679,002 B2

SEMICONDUCTIVE DEVICE HAVING IMPROVED COPPER DENSITY FOR PACKAGE-ON-PACKAGE APPLICATIONS

TECHNICAL FIELD OF THE INVENTION

This invention is directed in general to a semiconductor device and, more specifically, to a semiconductor device having improved metal density for package-on-package applications.

BACKGROUND OF THE INVENTION

Manufactures take great care at each step of the integrated circuit (IC) manufacturing process to ensure that the quality of the device is as high as possible. The packaging (i.e., enclosure surrounding and connections to the IC) is no different. After the manufacture of the ICs, there remains the need to protect the individual IC dies from damage and to provide connections to other devices. These IC dies are typically electrically connected and mounted on a substrate core that often includes several patterned layers of conductive material, such as copper, located on either or both sides of the substrate core. Electrical connection is made through the substrate by way of patterned traces on copper layers located both above and below the core of the substrate. The area below the core also includes copper shielding ground planes that are present to promote good electrical performance.

As technology device sizes have continued to shrink, the industry has moved to thinner substrates in an effort to reduce the overall height of the packaged die. Using these thinner cores, however, can cause problems to arise during the reflow of the packaged device onto another device or substrate. Conventional packaging substrates typically have several layers located above and below the substrate core. These layers have copper traces formed thereon and are connected by vias that extend through the layers. Together, they form interconnect structures above and below the substrate core. The substrate core is typically comprised of an epoxy resin and fiberglass and has a different thermal expansion coefficient than do the layers on which the copper traces are formed. Due to the difference in the thermal expansion coefficients of these materials and the high temperatures associated with the reflow soldering process, the outer edges of these thinner substrates will often warp or curve up or down such that all of the solder joints or ball grid arrays (BGA) that are located on the solder joint or back side of the substrate do not make proper contact with the underlying substrate. This lack of full or complete connectivity leads to a defective or less than an optimum device.

Accordingly, what is needed in the art is a semiconductive device and method of manufacturer thereof that avoids the disadvantages associated with the above-discussed devices.

SUMMARY OF THE INVENTION

The invention provides, in one embodiment, a semiconductor device that comprises a semiconductor device packaging substrate core. A first interconnect structure is located within a mold region and on a die side of the substrate core and has a first conductive metal density associated therewith. A second interconnect structure is located within the mold region and on a solder joint side of the substrate core and has a second conductive metal density associated therewith, wherein the second conductive metal density within the mold region is about equal to or less than the first conductive metal density within the mold region.

In another embodiment, a method of manufacturing a semiconductor device is provided. This embodiment comprises forming a first interconnect structure located within a mold region and on a die side of a semiconductor packaging substrate core. The first interconnect structure has a first conductive metal density associated with it. The method further comprise forming a second interconnect structure located within the mold region and on a solder joint side of the semiconductor packaging substrate core. The second interconnect structure has a second conductive metal density associated therewith. The second conductive metal density within the mold region is about equal to or less than the first conductive metal density within the mold region.

In another embodiment, a semiconductor device is provided that comprises a packaged IC chip that is located on a die side of a semiconductor device packaging substrate core. The IC chip is located within a mold region of the packaging substrate core and has a packing mold located over it. A first interconnect structure is located within the mold region and on a die side of the substrate core and has a first conductive metal density associated therewith. The device of this embodiment further includes a second interconnect structure that is located within the mold region and on a solder joint side of the substrate core and has a second conductive metal density associated therewith. The second conductive metal density within the mold region is about equal to or less than the first conductive metal density within the mold region.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
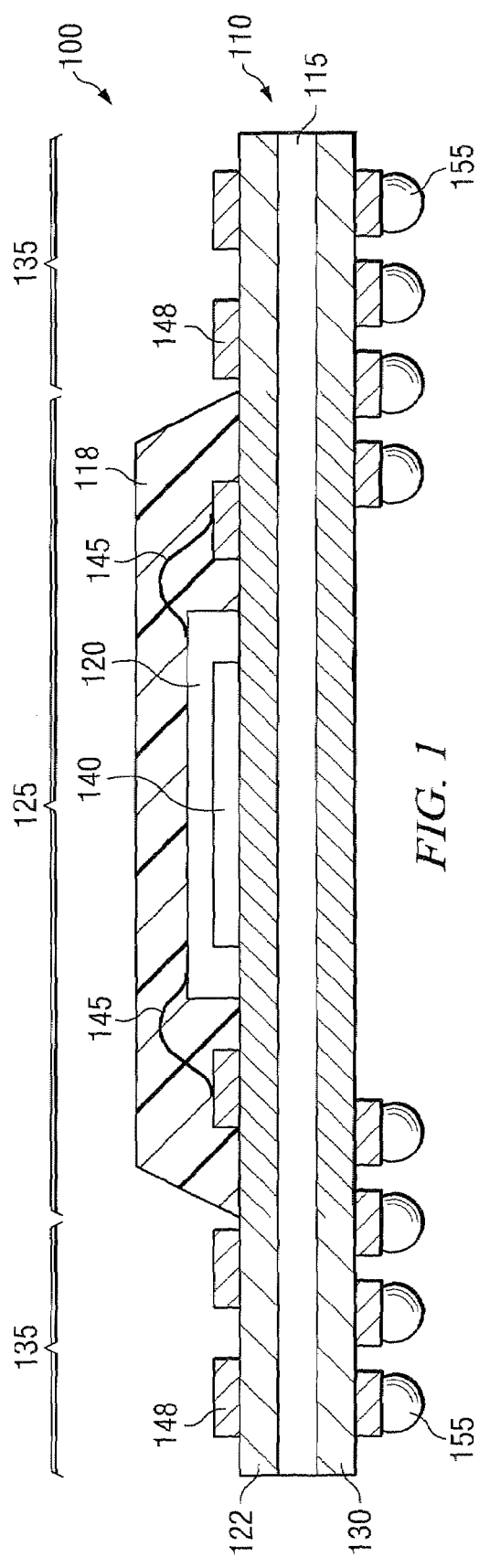
FIG. 1 illustrates a sectional view of a semiconductive device provided by the invention.

FIG. 1 generally illustrates one embodiment of a semiconductor device 100 of the invention. In this embodiment, the semiconductor device 100 includes a packaging substrate 110. The substrate 110 comprises a substrate core 115 that may be comprised of conventional materials. A molding compound 118 encapsulates a semiconductor chip 120. An interconnect structure 122 is located with a mold region 125 on a front side or die side of the core 115. The mold region 125 is a region of the substrate 110 that is designated or designed to receive the semiconductor chip 120 thereon and is substantially defined by the outer perimeter of the molding compound 118 that covers the semiconductor chip 120. It should be understood that the packaging substrate 110 may have many such regions to support many molded semiconductor device chips. The first interconnect structure 122 comprises metal and has a first conductive metal density associated therewith. The metal density is based on the amount of metal that is present in the first interconnect structure 122. As used herein, metal density in the total volume of metal in a layer per layer volume. The first interconnect structure 122 may include one or more layers having conductive metal traces thereon that are patterned to provide electrical connection within the semiconductor device 100. The illustrated embodiment also comprises a second interconnect structure 130 that is also located within the mold region 125 and on a back side or solder joint side of the core 115, as shown. The second interconnect structure 130 may also include one or more layers having conductive metal traces thereon that are patterned to provide electrical connection and within the semiconductor device 100 and to ground. The second interconnect structure 130 also has a second conductive metal density associated therewith. In this embodiment, the metal density within the mold region 125 above the core 115 is about equal to or greater than the metal density within the mold region 125 below the core 115.

With the invention, it has been realized that the density of the metal above the core 115 versus the metal below the core 115 has an impact on the amount of warpage that occurs in the packaging substrate 110. Moreover, it has been found that when the metal density above the core 115 is greater than the metal density below the core 115, there is less warpage that occurs in the packaging substrate 110. This improvement in warpage provides for a more co-planar packaging substrate, which allows for better solder contact between the packaging substrate and the substrate to which it is to be attached.

The core 115 also includes regions 135 outside the mold region 125. As seen in this embodiment, a portion of the first and second interconnect structures 122 and 130 extend into regions 135 as well.

The chip 120 comprises a semiconductor die 140 that is attached to the die side of the packaging substrate 110. The die 140 is typically encapsulated within a hard plastic material to form the chip 120, which is then secured to the packaging substrate 110. Bonding wires 145 are attached to the chip 120 and a bond pad 148 that electrically connects the chip 120 to the packaging substrate 110. Once attached to the packaging substrate 110, the chip 120 is encapsulated in the molding compound 118. Electrical connections between the chip 120 and solder balls 155 located on the solder joint side of the packaging substrate 110 are made through the first and second interconnect structures 122 and 130. Conventional processes and materials may be used to attach the chip 120, encapsulate it in the molding compound 118, and electrically connect it to the packaging substrate 110.

Figure 2:
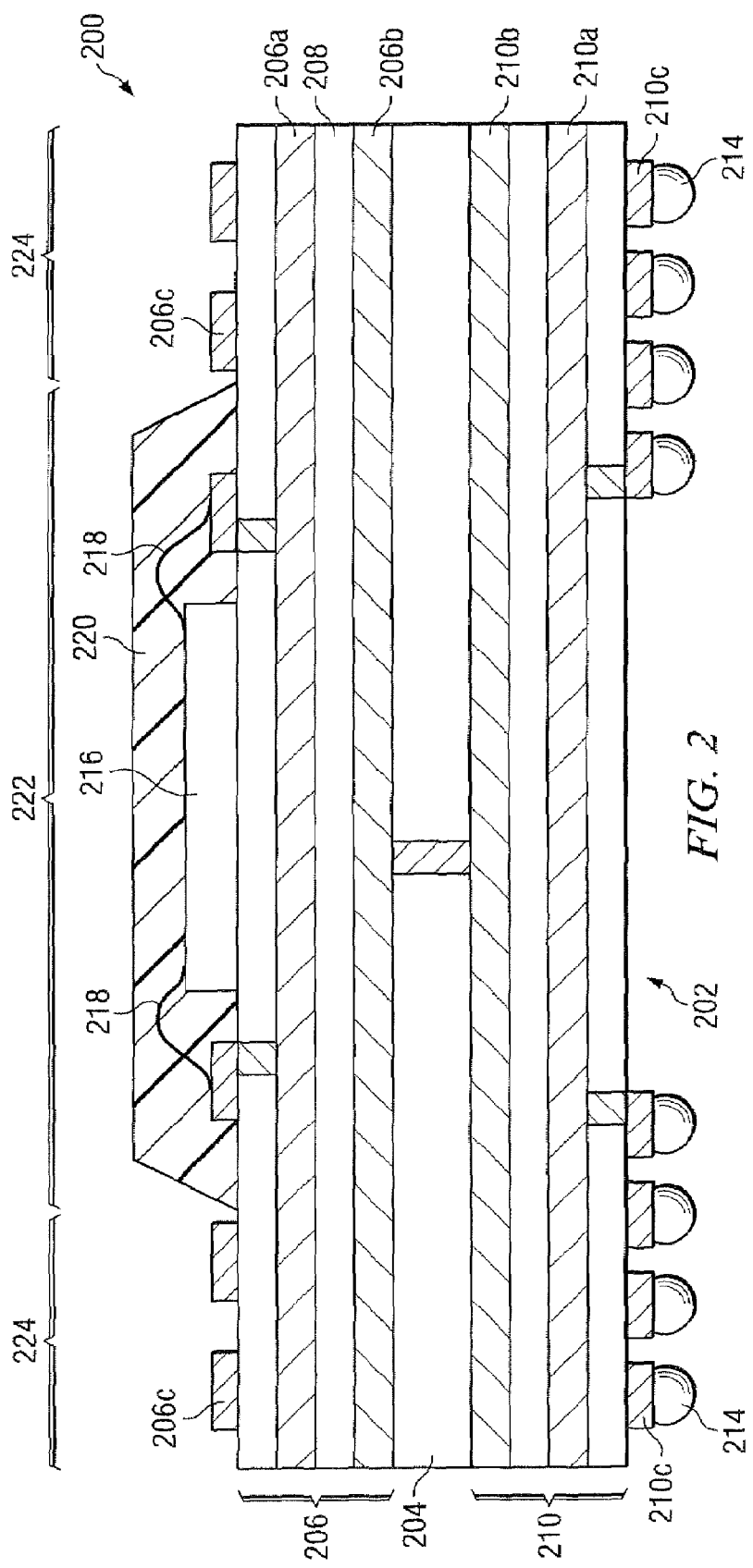
FIG. 2 illustrates a sectional view of another embodiment provided by the invention.

FIG. 2 is another embodiment of a semiconductor device 200 covered by the invention. The device 200 includes a packaging substrate 202 that includes a substrate core 204. The core 204 may be made of conventional materials, such as epoxy and fiberglass, and may have a glass transition temperature (Tg) associated with it that varies, depending on the material from which the core 204 is made. For example, in one embodiment, the Tg may be about 165° C. (TMA data), while in another embodiment, the Tg may be about 195° C. (TMA data). By way of example only, the core of the Tg 165 material may be comprised of a thermosetting resin that includes halogen, antimony, and red phosphorous. This particular substrate core may also have an elastic module ranging from about 27-30 gigapascals (Gpa). The core of the Tg 195 material, on the other hand, does not include halogen, antimony, and red phosphorous and has an elastic module ranging from about 22-24 Gpa. Both of these substrates are commercially available. It should be understood that the foregoing materials are given as examples only and that other materials known to those who are skilled in the art may also used. The thickness of the core 204 may also vary with design. For example, the thickness may range from about 50 microns or less to about 150 microns. In another embodiment, however, the thickness ranges from about 50 microns or less to about 100 microns. These thickness ranges are particularly applicable in the invention because it is at these thinner thicknesses where warpage more readily occurs as compared to substrate cores having thicknesses that are greater than about 150 microns.

An interconnect structure 206 is located above the core 204. The interconnect structure 206 may comprise any number of conductive layers that are located above the core 204. In the illustrated embodiment, the interconnect structure 206 includes at least two layers 206a and 206b that comprise a conductive metal, such as copper (Cu), and are separated by a prepreg layer 208, which may be comprised of the same material as the core 204, and in another embodiment, the interconnect structure 206 may also include a contact pad layer 206c. The layers 206a, 206b and 206c comprise layers on which conductive metal traces or pads, such as Cu traces or pads, are located.

The way in which these layers are patterned will vary based on the electrical function that they are to perform. Typically in conventional devices, the electrical interconnects are laid out based on certain design specifications and are then patterned to those specifications. In such instances, these conventional designs include certain trace widths or thicknesses. However, in the invention, the specifications of one or more of the layers may be adjusted to increase the metal density in interconnect structure 206. This may be accomplished in a number of ways. For example, the trace patterns on one or more layers of the interconnect structure 206 may be re-configured to achieve the same electrical function but increase the amount of metal within the trace pattern. In one embodiment, this could be achieved by increasing the line width or the thickness of the trace pattern in general. In another embodiment, dummy metal features may be added to the trace pattern. The dummy features are designed and placed such that they do not have any electrical function and are present for the purpose of increasing the amount of metal present in the interconnect structure 206. However, other embodiments of the invention do not prevent these dummy features from having an electrical function as well. As can be seen, any one or a combination of the above discussed techniques could be employed to increase the metal density. Of course, other ways of increasing the metal density are also within the scope of the invention.

The embodiment of the semiconductor device 200 shown in FIG. 2 further comprises an interconnect structure 210 that is located below the substrate core 204 or on the solder joint side or BGA side of the device 200. The interconnect structure 210 may also comprise any number of conductive layers, such as Cu, that are located below the substrate core 204. In the illustrated embodiment, the interconnect structure 210 includes at least two layers 210a and 210b that are separated by a prepreg layer 212, which may be comprised of the same material as the substrate core 204. In another embodiment, the interconnect structure 210 may also include a contact pad layer 210c on which solder balls, 214 may be formed. The layers 210a, 210b and 210c comprise layers on which conductive metal traces or pads, such as copper traces or pads, are located.

The way in which layers 210a, 210b and 210c are patterned will vary based on the electrical function that they are to perform. In conventional devices, the electrical interconnects are typically laid out based on certain design parameters. The layers are then patterned to those design specifications. In such instances, these conventional designs include certain trace widths or thicknesses. However, in the invention, the specifications of the layers may be adjusted to decrease the metal density in interconnect structure 210. This may be accomplished in a number of ways. For example, the trace patterns on one or more layers of the interconnect structure 210 may be re-configured to achieve the same electrical operation but reduce the amount of metal within the trace pattern. In one embodiment, this density reduction could be achieved by decreasing the line width or the thickness of the trace pattern in general. Given the teachings herein, other ways of decreasing the metal density that are apparent to those who are skilled in the art are also within the scope of the invention.

In the embodiment of FIG. 2, a semiconductor chip 216, which may be of conventional design, as that discussed above regarding FIG. 1, is located on the packaging substrate 202. The chip 216 is electrically connected to the interconnect layers 206 and 210 by bonding wires 218. A molding compound 220 that encapsulates the chip 216 and electrical contact components forms a mold region 222 over a portion of the packaging substrate 202. As seen in FIG. 2, a portion of the interconnect structures 206 and 210 lie under the mold region 222 and a portion of these structures lies in region 224 that are outside of the mold region 222.

As evident from the above discussion, the metal density of one or both of the interconnect structures 206 and 210 can be altered such that the metal density above the core is greater than the density below the core. This has the effect of reducing the amount of warpage (i.e., improving warpage) associated with packaging substrates. The metal density can be adjusted in the region under the mold, outside the mold, or in both regions, depending on the Tg of the core 204. Since the warpage is reduced, better and more reliable contact to an underlying substrate can be achieved.

Figures 3A, 3B:
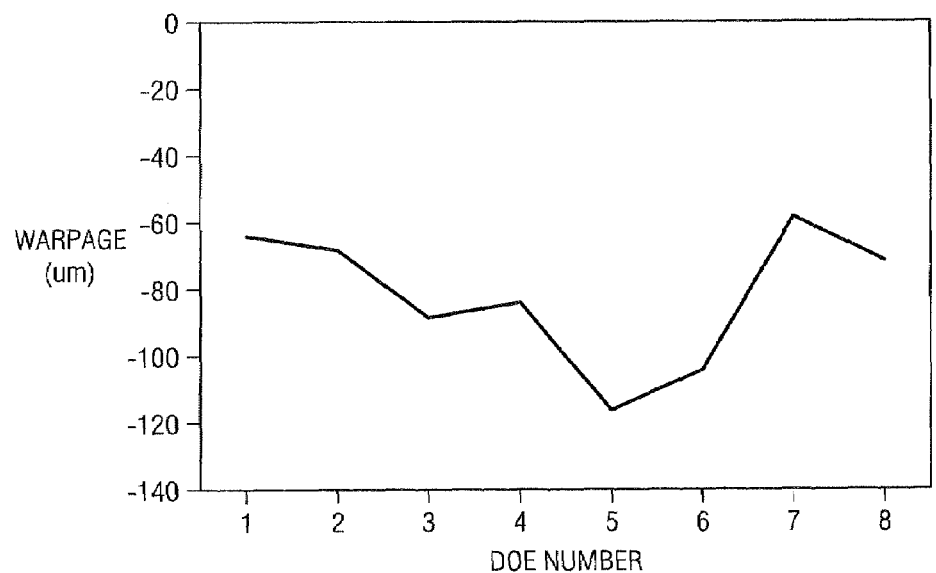
FIG. 3 is a graph of the data of a design of experiment data of different substrate cores having various metal densities associated therewith.

The reduced warpage that can be achieved in various embodiments of the invention is illustrated in FIG. 3. FIG. 3 is a graph of data from a design of experiment (DOE) data obtained from measuring the amount of warpage associated with eight different samples, each having a different metal density above and below the core. The DOE data included the metal density in layers 1, 2, 3, and 4 both under the mold region and outside the mold region for each sample. For purposes of illustration, the metal density in layers 2 and 3 was kept constant in the various samples. However, it should be understood that the metal densities in these layers may also be altered in certain embodiments as design parameters allow. Thus, the comparisons of the metal densities for purposes of illustration are between layers 1 and 4. FIG. 3 graphically illustrates the warpage associated with each sample. Based on the DOE data, in those samples where the metal density above the core (layer 1) was greater than the metal density below the core (layer 4), the amount of warpage is improved (i.e., the amount of warpage is decreased). Conversely, in those sample where the metal density above the core was less than the metal density below the core, the amount of warpage increased. It should be noted that the substrate cores used in the samples had a Tg of 165° C. (TMA data), and the ratio of the metal density above and below the core outside the mold had little to no impact on the warpage.

Figure 4:
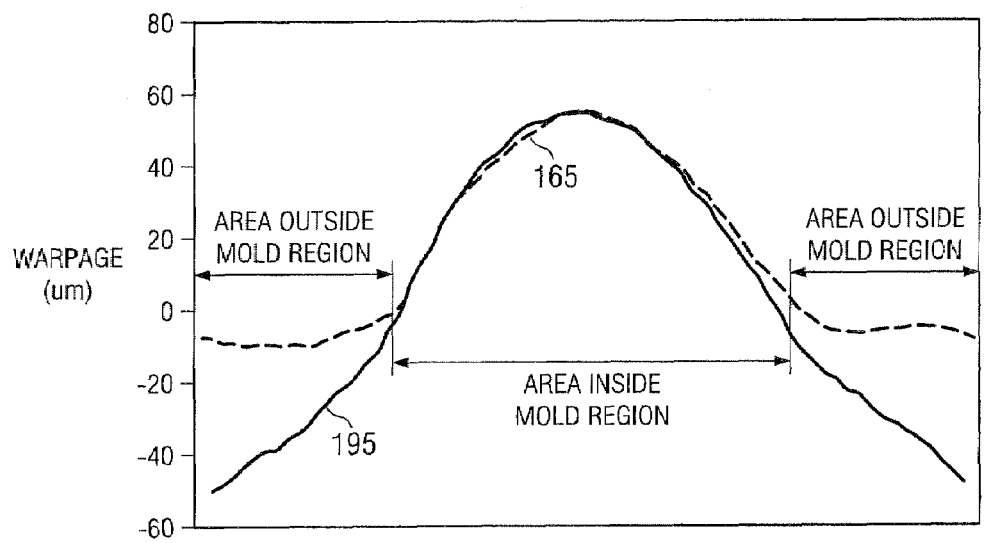
FIG. 4 is a graph showing how the glass transition of the substrate core affects core warpage outside of the mold region.

FIG. 4 is a graph that illustrates the impact metal density has on warpage outside the mold region as a function of the Tg of the substrate core. In FIG. 4, the warpage of a core having a Tg of 165° C. (represented by the dashed line) was compared to the warpage of a core having a Tg of 195° C. (represented by the solid line). For purposes of this illustration, the package samples used in the experiments had a metal density above the core that was lower than the metal density below the core and had a core thickness of about 100 microns. In the substrate core having a Tg of 165° C., the package warpage outside the mold area is almost flat and does not change significantly. It is believed that the reason for this is that the lower Tg allows the core to become soft and pliable at reflow temperatures of about 260° C. Therefore, the core more easily accommodates the warping stress associated with the core, and the metal density outside the mold area does not affect the warpage. However, when a core having a Tg of 195° C. is used, the package warpage outside the mold area shows an increase. It is believed that the reason for this is that the higher Tg keeps the substrate core stiffer and less pliable even at reflow temperatures of about 260° C. Therefore, the core does not easily accommodate the warping stress associated with the core, and in fact, it appears to enhance it. As such, the metal density outside the mold area does increase the warpage. Thus, in one embodiment, the metal density above the core should be greater than the metal density below the core when high glass transition materials are used in the substrate core. In lower glass transition materials, the metal outside the mold region has little to no impact.

Figure 5:
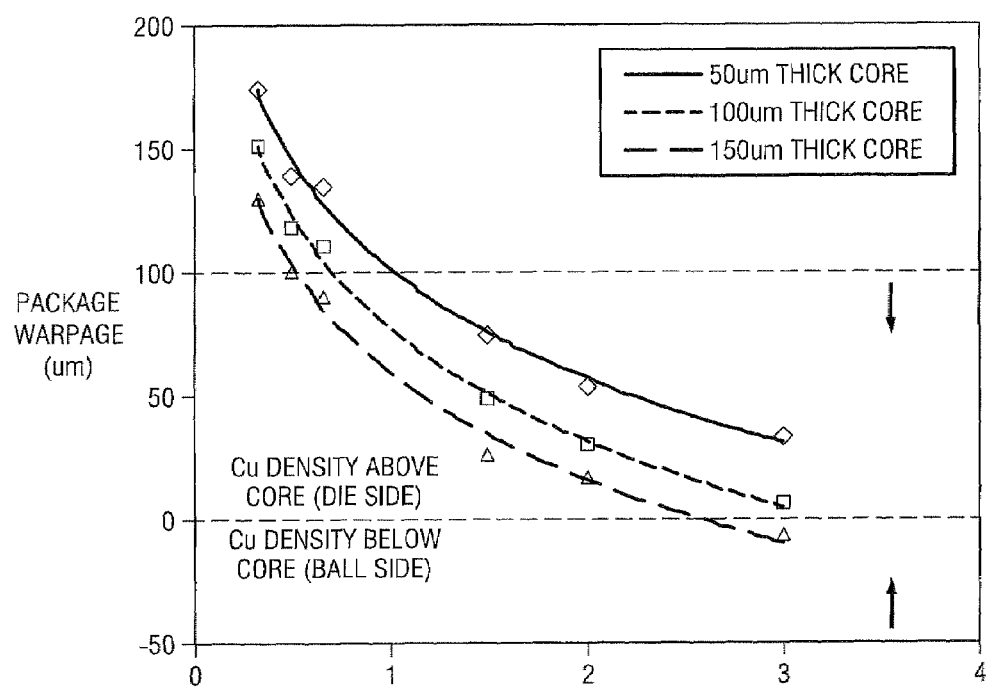
FIG. 5 is a graph showing how warpage is reduced where the metal density ratio is about 1 or greater.

FIG. 5 further illustrates how the warpage is improved when the metal density above the core is greater than the metal density below the core. In these sample embodiments, the metal density includes the area within the mold region and outside the mold region, and the cores of the substrates had a Tg of 165° C. (TMA data). Here, various data were gathered from a number of samples having core thicknesses ranging from about 50 microns to about 150 microns and having various metal density ratios. As seen from FIG. 5, there was an improvement in the warpage (e.g., ranged from about 100 microns to about −10 microns) when the density ratio above the core to that below the core was about 1 or greater. This held true with each of the different thicknesses of cores that were used.

Those skilled in the art to which the invention relates will appreciate that other and further additions, deletions, substitutions and modifications may be made to the described embodiments without departing from the scope of the invention.

What is claimed is:

1. A semiconductor device, comprising:
   a semiconductor chip affixed to a middle region of a substrate surface;
   a packing mold disposed within a mold region boundary enclosing the semiconductor chip and adhering to a portion of the substrate surface;
   the substrate having a core layer and a first metal pattern of a metal film on a first side of the core layer within a first boundary coextending the mold region boundary and a second metal pattern of a metal film on a second and opposite side of the core layer within a second boundary coextending the mold region boundary; and
   the first metal pattern having a first metal density, the second metal pattern having a second metal density lower than the first metal density.

2. The device recited in claim 1, wherein the core layer ranges from about 50 microns to about 150 microns in thickness.

3. The device recited in claim 1, wherein the substrate includes peripheral regions outside the mold region boundary having therein metal patterns extended from the first metal pattern and from the second metal pattern.

4. The device recited in claim 1, wherein the substrate warps less than 100 microns at elevated temperatures.

5. The device recited in claim 1, wherein the first metal pattern and the second metal pattern each comprises layers of copper traces.

6. A method of manufacturing a semiconductor device, comprising:
   defining a mold region boundary;
   forming a substrate having an insulating core layer and a first side for affixing semiconductor chips;
   forming a first metal pattern of a metal film on the first side of the core layer within the substrate circumscribed by the mold region boundary and having a first metal density; and
   forming a second metal pattern of a metal film on a second and opposite side of the core layer within the substrate circumscribed by the mold region boundary and having a second metal density lower than the first metal density.

7. The method recited in claim 6, wherein the core layer ranges from about 50 microns to about 150 microns in thickness.

8. The method recited in claim 6, wherein the substrate further includes regions outside the mold region boundary and metal patterns extending from the first metal pattern and from the second metal pattern in the regions outside the mold region boundary.

9. The method recited in claim 6, wherein the first metal pattern and the second metal pattern each comprises layers of copper traces.

10. The method recited in claim 6, further comprising affixing a semiconductor chip on a substrate surface adjacent the first side of the core layer; and enclosing the semiconductor chip and covering a portion of the substrate surface coextending the mold region boundary with a packing mold.

11. The method recited in claim 10, further including connecting the semiconductor chip to the first metal pattern and to the second metal pattern.

* * * * *